United States Patent
Fujita

(10) Patent No.: US 6,809,798 B1
(45) Date of Patent: Oct. 26, 2004

(54) STAGE CONTROL METHOD, EXPOSURE METHOD, EXPOSURE APPARATUS AND DEVICE MANUFACTURING METHOD

(75) Inventor: Itaru Fujita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/519,990

(22) Filed: Mar. 7, 2000

(30) Foreign Application Priority Data

Mar. 9, 1999 (JP) ............................................ 11-061532

(51) Int. Cl.$^7$ ........................ G03B 27/42; G03B 27/32; G03B 19/33
(52) U.S. Cl. ............................. 355/53; 355/77; 318/575
(58) Field of Search ........................ 355/53, 77, 72–76; 318/575; 250/548; 356/399–401; 310/10, 12

(56) References Cited

U.S. PATENT DOCUMENTS

| | | | |
|---|---|---|---|
| 5,483,311 A | * 1/1996 | Sakakibara et al. | 355/53 |
| 5,617,182 A | 4/1997 | Wakamoto et al. | 355/53 |
| 5,677,754 A | 10/1997 | Makinouchi | 355/53 |
| 5,883,702 A | * 3/1999 | Tokunaga | 355/53 |
| 5,995,203 A | * 11/1999 | Ueda | 355/67 |
| 6,260,282 B1 | * 7/2001 | Yuan et al. | 33/1 M |
| 6,285,438 B1 | * 9/2001 | Hazelton et al. | 355/53 |

FOREIGN PATENT DOCUMENTS

| | | |
|---|---|---|
| EP | 0 785 571 A2 | 7/1997 |
| EP | 0 819 988 A1 | 1/1998 |
| JP | 2000-294479 | 10/2000 |

OTHER PUBLICATIONS

Patent Abstracts of Japan, vol. 2000, No. 13, Feb. 5, 2001 (JP 2000–294479, Oct. 20, 2000).

* cited by examiner

Primary Examiner—Henry Hung Nguyen
(74) Attorney, Agent, or Firm—Fitzpatrick, Cella, Harper & Scinto

(57) ABSTRACT

An exposure method for scanning a master plate having a pattern and a photosensitive substrate relative to a projection optical system for projecting the pattern onto the substrate. The method includes a first step of accelerating a stage to a predetermined velocity, the stage holding the master plate or the substrate, a second step of transporting the stage at the predetermined velocity and exposing the substrate to the pattern during travel of the stage in a scanning direction, a third step of stopping the stage traveling at the predetermined velocity, and an acceleration step of accelerating the stage between the second step and the third step.

37 Claims, 10 Drawing Sheets

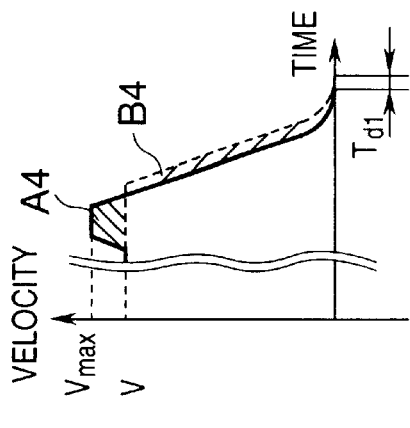
FIG. 3A
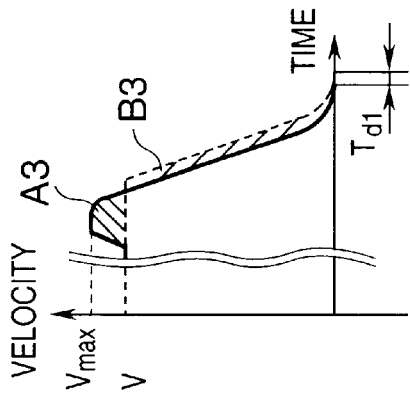
FIG. 3B
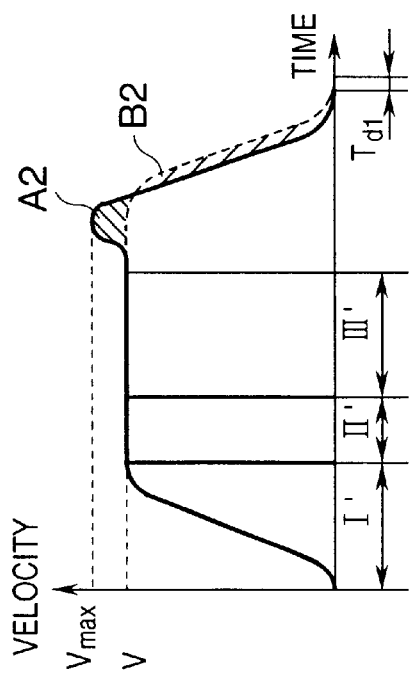
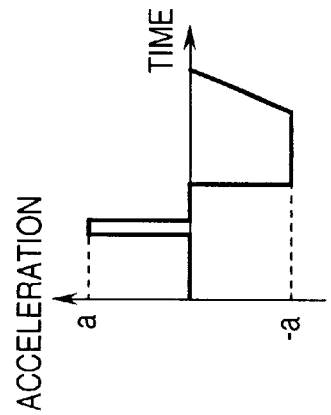
FIG. 3C
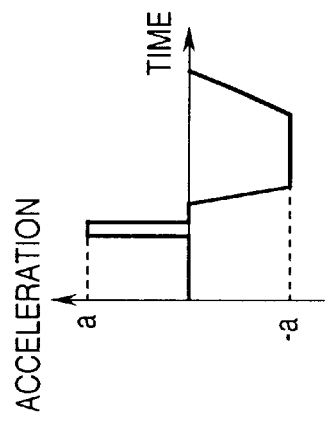
FIG. 3D
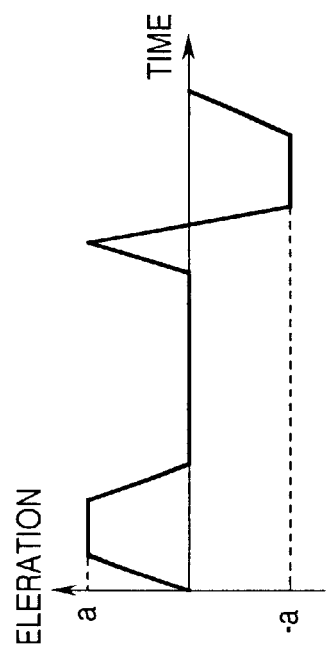
FIG. 3E
FIG. 3F

STAGE CONTROL METHOD, EXPOSURE METHOD, EXPOSURE APPARATUS AND DEVICE MANUFACTURING METHOD

FIELD OF THE INVENTION

This invention relates to a method of controlling a stage in a stage apparatus that requires a high-speed, high-precision positioning capability. More particularly, the invention relates to the field of substrate scanning and exposure, and especially to a method of controlling the stage of a scanning exposure apparatus in which the pattern of a semiconductor or liquid crystal display elements is transferred to a substrate by photolithography. Further, the present invention falls under the category of exposure methods and apparatus as well as device manufacturing methods that utilize such a stage control method.

BACKGROUND OF THE INVENTION

A process for forming fine patterns on a device substrate in the manufacture of semiconductors and liquid crystal display devices generally utilizes a photolithography technique. An original pattern to undergo transfer is formed as a raised or recessed pattern on the light shielding surface of a glass substrate referred to as a reticle or mask. The pattern on this master plate exposed by illuminating light is projected for exposure onto a semiconductor wafer (referred to simply as a wafer below) or glass substrate for a liquid crystal, which wafer or substrate has been coated with a photosensitive photoresist, via projection optics, whereby the latent image of the pattern is transferred to the resist. The substrate to be exposed is itself worked by carrying out etching in which the ratio of the selectivity of the worked surface to that of the resist image formed by developing is high.

In photolithographic processes especially for manufacturing semiconductor devices, use of light in an exposure apparatus referred to as a stepper has been in the forefront until recently. This exposure method employs a step-and-repeat scheme in which exposure areas (shot areas) obtained by subdividing a wafer are successively moved into an exposure field of the projection aligner optics and exposed to the pattern on the reticle after the wafer is positioned and stopped.

There is an increasing demand for semiconductor devices of higher speed, greater capacity and lower cost and, in terms of the production line, there is a need also of an exposure apparatus that makes it possible to attain much finer working in small chip areas. Accordingly, there has been proposed a step-and-scan scheme that makes it possible to realize, with a high degree of productivity, an improvement in the resolving power of the projection optics and better pattern uniformity in the exposure area.

This scheme scans the reticle and wafer synchronously with respect to the projection optics and performs exposure at the same time that the shot area is scanned relative to the exposure field. The reticle and wafer are adjusted to have a demagnification ratio that the projection optical system provides both longitudinally and transversely, whereby the reticle pattern is projected onto the wafer at the demagnification ratio. It is required that the scanning speed of the exposure area be controlled so as to be constant in order to control the amount of exposure to a prescribed amount in conformity with the properties and film thickness of the resist and in dependence upon the reticle pattern. To this end, the reticle and wafer must each attain a prescribed scanning speed before the reticle and the area to be exposed on the wafer enter the slit-shaped exposure area of the exposure apparatus.

FIGS. 10A and 10B illustrate the control sequence of a stage device holding a reticle or wafer. FIG. 10A illustrates the velocity profile (target velocity vs. time) of the stage and FIG. 10B illustrates the acceleration profile (target acceleration vs. time) of the stage.

In FIGS. 10A and 10B, an elapsed time from a start of scanning is plotted along the horizontal axis. The end time indicates the time relating to one shot of exposure (shot processing time). The shot processing time is an important indicator that decides the processing time of one wafer.

As shown in FIG. 10A, shot processing time is divided into five intervals. Stage operation will now be described in relation to these intervals.

First, the stage is accelerated along the scanning direction from the at-rest position until it attains a target scanning velocity. This is the acceleration time and corresponds to interval I. After acceleration ends, velocity is controlled in such a manner that a variation in sychronization will fall within a tolerance. This is the settling time and corresponds to interval II. The distance traveled by the stage during the total of the acceleration time and settling time is referred to as the approach distance. The stage is then caused to travel at a constant velocity to perform exposure. This is the exposure time and corresponds to interval III. Next, the stage is allowed to travel for a time approximately equal to the settling time while the scanning velocity thereof is held constant. This is the post-settling time and corresponds to interval IV. Deceleration of the stage then starts and the stage comes to rest with respect to the scanning direction. This is the deceleration time and corresponds to interval IV. The distance traveled by the stage during the total of the post-settling time and deceleration time is referred to as the overrun distance. The approach distance and overrun distance are approximately equal.

In most cases of stage operation described above, the scanning direction is reversed after the stage is decelerated and stopped, and then the operation of intervals I to V is repeated. In rare cases, scanning is repeated in the same direction.

In the case of a wafer stage, movement of the exposure field is started toward the scanning starting position of the next exposure shot after the exposure in interval III ends. The move operation is referred to as a stepping operation. The start of stepping movement of the wafer stage in a direction perpendicular to the scanning direction is carried out immediately after exposure ends. In the scanning direction, however, there is no particular stepping movement or stepping movement is started at the end of operation in interval V. The reason for this is as follows: In many cases the next exposure shot is immediately adjacent in the direction perpendicular to the scanning direction and, as a result, the position at which the stage in interval V ends is the starting position of the next scan, thus making it unnecessary to take the trouble to perform the stepping operation. In other words, the operations in intervals IV and V themselves may be said to be transposable in terms of operation in the scanning direction until the next exposure shot.

The following problems arise in the prior art:

(1) Exposure energy Ed per wafer unit area is proportional to the illuminance of the slit light and inversely proportional to scanning velocity. In the example of the prior art described above, scanning velocity is held substantially constant during post-settling time.

Consequently, if the photoresist has little sensitivity and the scanning velocity is low, overrun time lengthens and throughput declines. This tendency becomes more pronounced if settling time is prolonged in order to improve synchronization precision at the time of exposure.

(2) In the prior art, the operations of intervals I to V are repeated for all shot areas. Accordingly, if, when a row of shots is changed, the scanning direction of the final shot of the initial row is the forward direction and the direction of step and scan for the first shot of the next row is the reverse direction, then, after exposure of the final shot of the row ends, it is required that the wafer stage be reversed after traveling a prescribed overrun distance in the Y direction and that the stage travel a further distance equal to the sum of the overrun distance and the stepping distance. Accordingly, the amount of unnecessary travel equivalent to double the overrun distance inevitably causes a decline in throughput. In addition, after exposure of the final shot of the wafer, the overrun operation for exposure of a subsequent shot naturally is unnecessary and this too invites a decline in throughput. Moreover, there are special cases in which the scanning directions between mutually adjacent shots on part of the wafer or in all areas must be made to coincide. The purpose of this is to reduce a shot-to-shot difference in image distortion caused by a difference in scanning direction. However, since the overrun direction and stepping direction are always different at such time, this problem arises with the exposure of every shot.

SUMMARY OF THE INVENTION

A stage control method according to the present invention for the purpose of solving the aforementioned problems comprises a first step of accelerating a stage up to a predetermined velocity; a second step of transporting the stage at the predetermined velocity; and a third step of decelerating and stopping the stage; the method having a step of accelerating the stage prior to the third step.

Another stage control method according to the present invention for the purpose of solving the aforementioned problems comprises a deceleration of decelerating a stage transporting at a predetermined velocity; and an acceleration step of accelerating the stage prior to the deceleration step.

A stage apparatus according to the present invention for the purpose of solving the aforementioned problems comprises a stage which is capable of being moved; an actuator for driving the stage; and a control system for storing or setting a profile for accelerating the stage transporting at a predetermined velocity prior to a deceleration of the stage.

An exposure method according to the present invention for the purpose of solving the aforementioned problems comprises a first step of accelerating a stage up to a predetermined velocity, the stage holding a master plate or a substrate; a second step of transporting the stage at the predetermined velocity and exposing the substrate to a pattern during travel of the stage in a scanning direction; and a third step of stopping the stage traveling at the predetermined velocity; the method having a step of accelerating the stage prior to the third step.

Another exposure method according to the present invention for the purpose of solving the aforementioned problems having a first step of accelerating a stage up to a predetermined velocity, the stage holding a substrate, a second step of transporting the stage at the predetermined velocity and exposing the substrate to a pattern, which has been formed on a master plate, during travel of the stage in a scanning direction, and a third step of stopping the stage traveling at the predetermined velocity, wherein the substrate being exposed to a plurality of the patterns by repeating the first through third steps, said exposure method comprises, wherein a position at which the stage is stopped by the third step is substantially the same as a starting position of the first step for exposing the substrate the next time.

A further exposure method according to the present invention for the purpose of solving the aforementioned problems having a first step of accelerating a stage up to a predetermined velocity, the stage holding a substrate, a second step of transporting the stage at the predetermined velocity and exposing the substrate to a pattern, which has been formed on a master plate, during travel of the stage in a scanning direction, and a third step of stopping the stage traveling at the predetermined velocity, wherein the substrate being exposed to a plurality of the patterns by repeating the first through third steps, said exposure method comprises, wherein when, after the second step, the direction of movement of the stage in relation to the scanning direction thereof when the stage has been moved to a starting position of a subsequent first step coincides with the scanning direction of the stage in the second step when the next exposure is performed, a transition to the second step is made without stopping the stage at the starting position of the first step.

A further stage control method according to the present invention for the purpose of solving the aforementioned problems comprises a first step of accelerating a stage holding a substrate to a predetermined velocity; a second step of transporting the stage at the predetermined velocity and exposing the substrate to a pattern which has been formed on a master plate during travel of the stage in a scanning direction; a third step of decelerating and stopping the stage traveling at the predetermined velocity; and a comparison of comparing a step of moving a starting position of the next first step after an overrun operation of the second step in order to perform the second step, with a step of moving a starting position of the next first step without the overrun operation.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 3A to 3F are diagrams illustrating velocity and acceleration profiles of a scanning stage according to a second embodiment of the present invention;

DESCRIPTION OF THE PREFERRED EMBODIMENTS

Preferred embodiments of the present invention will now be described in detail in accordance with the accompanying drawings.

First Embodiment

Figure 1:
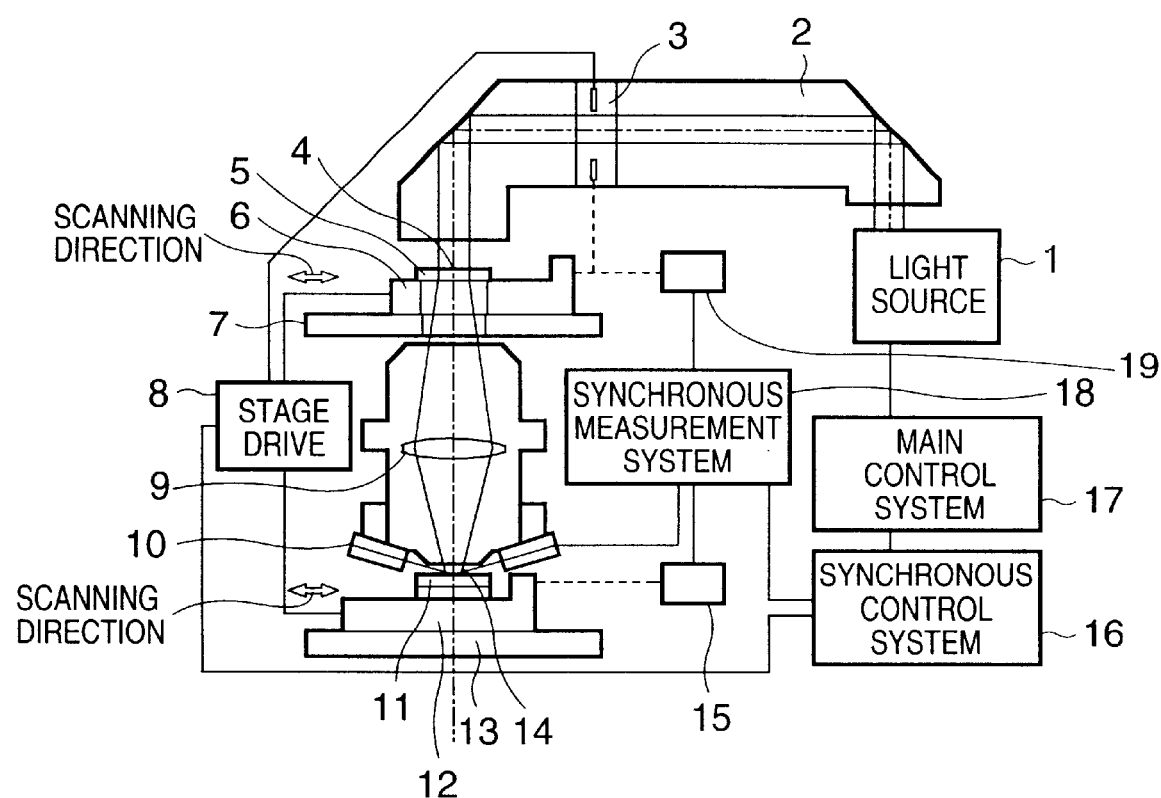
FIG. 1 is a diagram showing the construction of a scanning-type exposure apparatus according to the present invention.

FIG. 1 illustrates a step-and-scan exposure apparatus. Step-and-scan exposure in the Y direction will be taken as an example, with the longitudinal and transverse directions of the slit being taken as the X and Y directions, respectively.

As shown in FIG. 1, exposing light from a light source 1 has its illuminance and angle of incidence uniformalized and is converted to rectangular or arcuate slit light 4 in an illuminating system 2. The slit light impinges upon a reticle 5 on which a fine pattern has been formed. An ultra-high-voltage mercury vapor lamp or excimer laser is employed as the light source 1, though this does not impose a limitation upon the invention. The reticle 5 is held by a reticle stage 6. Upon passing through the reticle 5, the slit light 4 passes through projection optics 9 and has its image formed as a slit light 14 in an exposure field on a plane that is optically a conjugate plane with respect to the pattern plane of reticle 5. At the time of exposure, control is carried out in such a manner that the exposure surface of a wafer 11 held by a wafer stage 12 will coincide with the exposure field. The reticle stage 6 and wafer stage 12 travel with respect to the projection optics 9 while synchronized so that the pattern is transferred to a photoresist layer on the wafer 11 by the slit light 14. As in the manner of the wafer 11 and wafer stage 12, a movable masking stage 3 is placed in the illuminating system 2 on a plane that is optically a conjugate plane with respect to the pattern plane of the reticle and travels relative to the optic axis of the illuminating system 2 while in sync with the reticle stage 6. The movable masking stage 3 has an aperture that defines a similar figure in terms of the optical magnification ratio so that only a predetermined exposure area of the reticle 5 will be exposed. The wafer 11 is shielded from the slit light in an area in which the exposure field deviates from the shot area, and hence the exposure of other shot areas can be prevented.

The reticle stage 6 and wafer stage 12 are capable of having their position and velocity controlled in the Y direction, which is the scanning direction, with the former having its position controlled along X and θ axes and the latter along six axes which include the Y axis. The movable masking stage 3 has its masking aperture controlled along two axes, namely along the X and Y directions. The actuators of all stages are non contact actuators such as linear motors and power is supplied from a stage drive system 8.

The stage position measuring system includes XYθ 3-axis inteferometers (only the Y-axis interferometer is shown, namely, an interferometer 19 for measurement of reticle position along the Y axis) on the side of reticle stage 6, XYZθ and tilt (ωx, ωy) 6-axis interferometers (only the Y-axis interferometer is shown, namely, an interferometer 15 for measurement of wafer position along the Y axis) on the side of wafer stage 12, and a focus sensor 10. The movable masking stage 3 has encoders (not shown) for four axes. These are controlled by a synchronous measurement system 18. To perform synchronous control of the reticle stage and wafer stage in the Y direction, a deviation representing a deviation in synchronization is calculated from measurement values obtained from the reticle interferometer 19 for Y measurement and from the wafer interferometer 15 for Y measurement, and the deviation in synchronization is corrected by making either the reticle stage 6 or wafer stage 12 the master and the other the slave. In this case, preferably, the deviation in synchronization is corrected by making the reticle stage 6 the slave and the wafer stage 12 the master, since a movement of the reticle stage 6 is more controllable than that of the wafer stage 12. Control of the reticle stage 6 and wafer stage 6 in the X and θ directions also is performed in a manner similar to control in the Y direction.

The reticle stage 6 is supported so as to lie substantially parallel to the travel reference plane of a reticle stage guide 7. As a result, the position of the reticle pattern plane is assured in the Z, ωx and ωy directions. To control the wafer stage in the Z, ωx and ωy directions, the exposure plane of the wafer and the travel plane of the wafer stage are measured by the wafer focus sensor 10, and the wafer position is corrected by the wafer stage 12 in such a manner that the reticle pattern plane and wafer exposure plane, as well as the travel plane of the reticle stage and the travel plane of the wafer stage, will be situated as mutually conjugate planes via the projection optics.

The above-described synchronous control and control for correcting the position of the wafer plane is carried out by a synchronous control system 16 situated at a rank superior to that of the stage drive system 8 and synchronous measurement system 18. A main control system 17 performs sequential control (control of the output of the light source, control of changing wafers and reticles, etc.) other than synchronous control and delivers information concerning the running conditions of all stages (e.g., travel path, velocity and acceleration of the wafer stage 12) to the synchronous control system 16. The main control system 17, because of controlling the stage using velocity profiles described later, stores or sets the velocity profiles into a memory according to a layout of a shot on the wafer 11.

The stage position measurement system that provides the measurement reference and the reticle stage guide 7 that provides the position reference are fixed to a table (not shown) that holds the projection optics. In other words, measurement of position is carried out using the projection optics as a reference. Further, the wafer stage 12 is placed upon a wafer stage guide 13 supported by a vibration-proof mount (not shown).

The operating sequence of this apparatus will be described next. The positioning reference in the description to follow is the projection optics 9. The reticle stage 6 has already been positioned. The wafer 11 is delivered to the wafer stage 12 from a wafer transport system (not shown). The wafer 11 is subsequently controlled by the wafer stage 12. The position of the wafer 11 is detected by a wafer alignment system (not shown), and scanning exposure is carried out after the exposure field and the scanning starting position of a first exposure shot area on the wafer 11 are made to coincide. Upon the completion of exposure, the wafer 11 is moved to the next shot area immediately and the wafer 11 is positioned at the starting position of the next scan, after which scanning exposure is repeated in a similar fashion. The shot areas are arrayed as a two-dimensional grid on the wafer 11. Usually, the shots in the same row in the X direction are exposed in order, then, when the exposure of one row ends, the wafer is stepped in the Y direction to change the row of shots to be exposed. Exposure of this row then follows. By repeating this operation, the exposure of all shots is completed and the wafer is exchanged for a new wafer that is to undergo exposure.

Figure 2A:
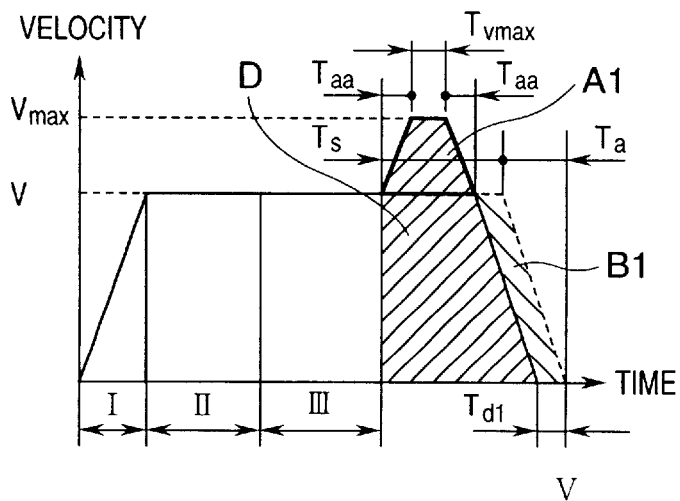
FIGS. 2A, 2B and 2C are diagrams illustrating velocity and acceleration profiles of a scanning stage according to a first embodiment of the present invention.
Figure 2B:
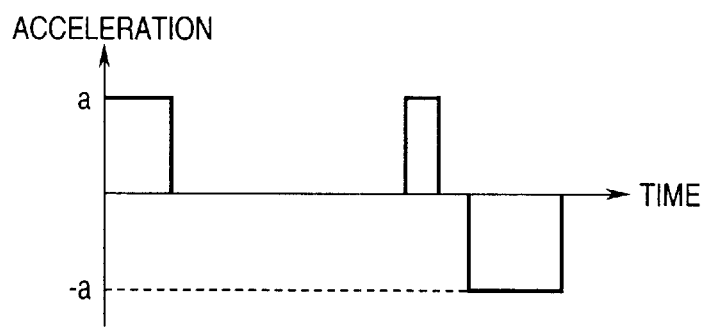
Figure 2C:
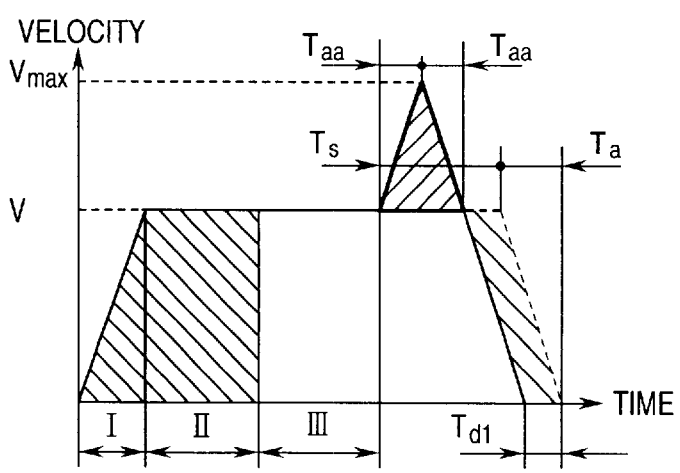

FIGS. 2A, 2B and 2C are diagrams useful in describing a first embodiment of a stage control method according to the present invention. FIGS. 2A and 2B illustrate velocity and acceleration profiles, respectively, of the wafer stage 12, similar to the profile of FIG. 10A described earlier.

FIGS. 2A and 2B illustrate one shot scan from beginning to end. In FIGS. 2A, 2B and in FIGS. 10A, 10B, the scanning velocities V, accelerations/decelerations a, acceleration times Ta, settling times Ts and exposure times Tex are the same. Further, the velocity profile of FIG. 10A has been added on in FIG. 2A. The maximum velocity of the stage in FIG. 2A is Vmax.

Figure 10A:
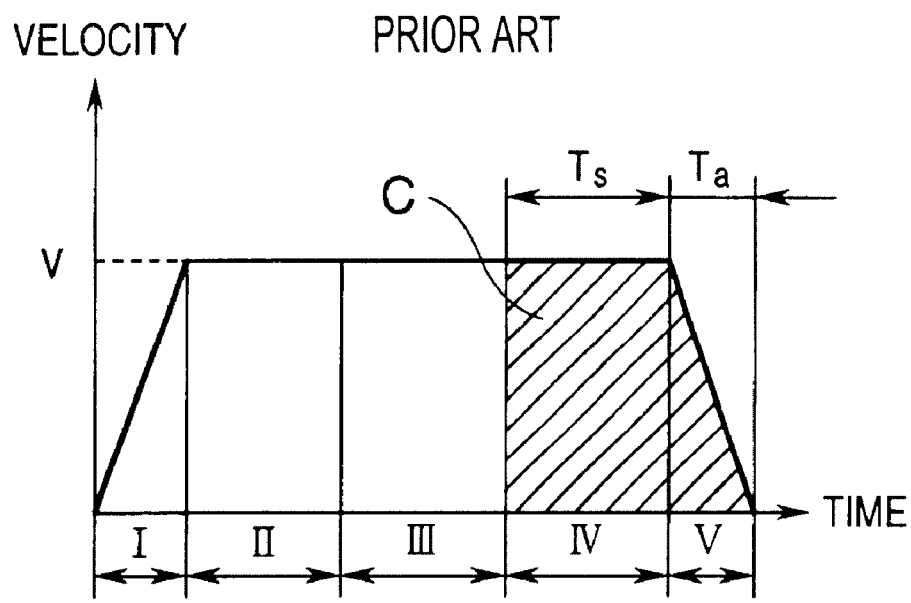
FIGS. 10A and 10B are diagrams illustrating velocity and acceleration profiles of a scanning stage according to the prior art.
Figure 10B:
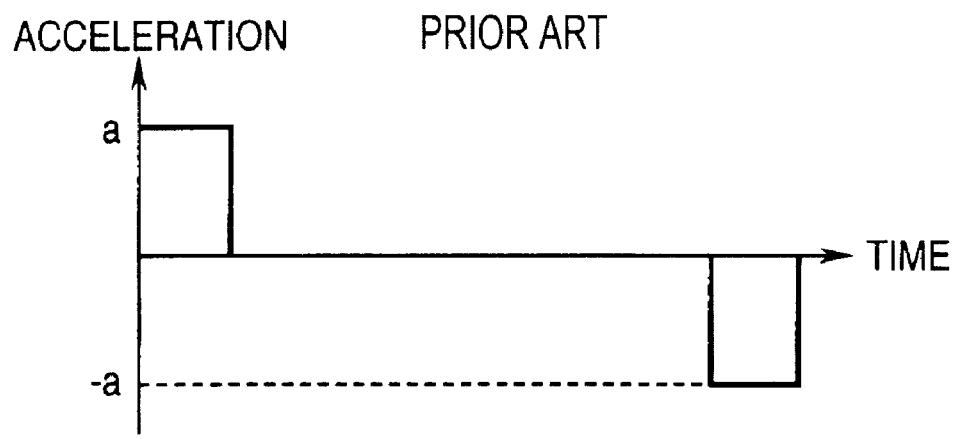

The method of stage control according to the present invention differs from that of the prior art in that the velocity profile from the end of exposure to the stop of the wafer stage 12 is different. In FIG. 10A, which shows the conventional method of stage control, travel of the stage continues for the post-settling time Ts at the velocity V even after the end of exposure, and then starting deceleraton, the stage comes to rest in deceleration time Ta. By contrast, in FIG. 2A showing the control method of the present invention, after exposure ends, the stage is accelerated over a maximum-acceleration time Taa, attains the maximum velocity Vmax, travels at the maximum velocity for a time Tvmax, then starts to be decelerated and returns to velocity V over a deceleration time Taa. The stage is decelerated further and then comes to rest.

The area D indicated by the ascending hatching rising in FIG. 2A represents overrun distance. Accordingly, the relationship between the area A1 of the bold-line trapezoid, in which the traveling velocity is greater than V, and the area B1 of the portion (indicated by the descending hatching) at which there is no overlap with the conventional method of control is as follows:

$$A1=B1 \quad (1)$$

$$A1=(Vmax-V) \times (Taa+Tvax) \quad (2)$$

$$B1=Td1 \times V \quad (3)$$

Where Td1 is a reduction time to be able to reduce processing time according to the present invention.

Accordingly, a time reduction Td1 obtained by the method of stage control of the present invention can be expressed as follows:

$$Td1=(Vmax-V) \times (Taa+Tvax)/V \quad (4)$$

If Td1 is calculated using the values of V and Vmax already known, we have $$Td1=(1-V/Vmax) \times \{Ts-(Vmax-V)/a\} \quad (5)$$

However, Vmax at this time has an upper-limit value for satisfying Equations (1) to (5).

$$Vmax=\{V \times a \times (Ts+V)\}^{0.5}$$

$$Vmax=a \times \{Ta \times (Ts+Ta)\}^{0.5} \quad (6)$$

$$\text{where } Ta=V/a \quad (7)$$

The velocity profile in a case where Equation (6) is not satisfied is as shown in FIG. 2C. At Tvmax=0, A1 is a triangle. Vmax at this time is as follows:

$$Vmax=a \times \{Ta \times (Ts+Ta)\}^{0.5} \quad (8)$$

As in the example of FIG. 2A, Td1 can be calculated from Equation (5).

In regard to the improvement in throughput of this embodiment when a comparison is made taking processing time per wafer as an example, it is possible to shorten the processing time by about Td×N, where N represents the total number of shots on one wafer.

The method of stage control according to this embodiment is not limited to the wafer stage; it can be applied to the reticle stage as well. Also, it can be applied to control of a stage apparatus except an exposure apparatus.

Second Embodiment

FIGS. 3A to 3F illustrate a second embodiment of a stage control method according to the present invention.

Only three types of overrun travel are provided in the first embodiment, namely travel at uniform velocity, travel at uniform acceleration and travel at uniform deceleration. As a consequence, travel acceleration varies discontinuously. In this embodiment, therefore, stage travel is controlled in such a manner that acceleration applied to the stage before exposure and immediately after the end of exposure will vary continuously.

FIG. 3A illustrates a velocity profile and FIG. 3B an acceleration profile. FIGS. 3A and 3B illustrate profiles of one shot scan from beginning to end.

Starting from rest, the stage is accelerated in such a manner that its acceleration varies continuously until a target scanning velocity is attained (I'). Following the end of acceleration, velocity is controlled so that synchronous deviation will fall within a tolerance (II'). Exposure is carried out while synchronous control is performed at the scanning velocity (III'). After exposure ends, the stage is accelerated in such a manner that acceleration varies continuously, and then the stage is decelerated in such a manner that its deceleration varies continuously, and the stage is brought to rest (the solid line).

In FIG. 3A, the dashed line indicates the prior-art profile, namely the profile in a case where the stage is not accelerated after the end of exposure but is allowed to travel for the post-settling time, after which the stage is decelerated and stopped in such a manner that its acceleration varies continuously.

In this case, also, the basic approach of the foregoing embodiment can be applied in a similar fashion. That is, area A2 (the ascending hatching) and area B2 (the descending hatching) may be calculated from known values in accordance with Equations (1) to (8).

Further, following the end of exposure, it is not necessarily required for the change in acceleration to be continuous over the total overrun time. It is permissible, therefore, to shorten the overrun time by making the change in acceleration continuous only in the deceleration region, as shown in FIGS. 3C and 3D. Alternatively, the change may be made continuous only at the time of deceleration immediately before the stage comes to rest (FIGS. 3E and 3F). In this case, also, the calculation method is the same as that described earlier.

Control of stage travel in this embodiment suppresses a discontinuous change in acceleration. As a result, it is possible to reduce the worst of positioning precision of the stage and distortion of the resist image, a decline in contrast and diminished durability of the stage itself caused by vibration produced by the stage during travel.

Third Embodiment

Figure 4A:
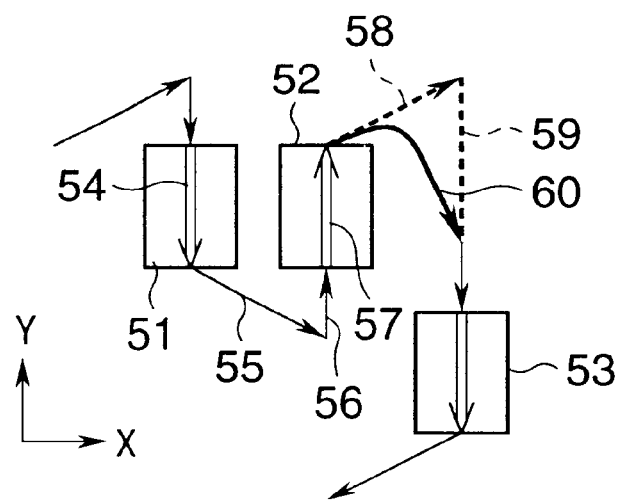
FIGS. 4A to 4C are diagrams illustrating paths of an exposure field according to a third embodiment of the present invention.
Figure 4B:
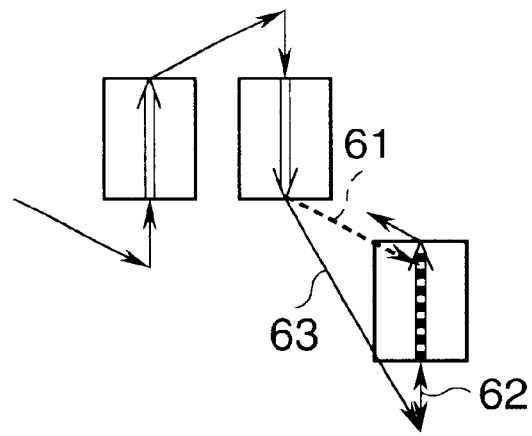
Figure 4C:
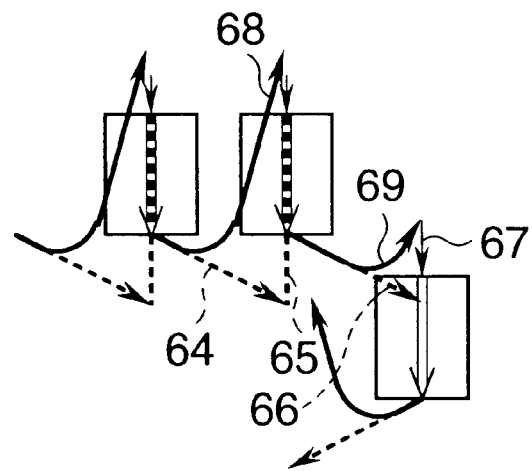

FIGS. 4A to 4C illustrate an exposure operation according to a third embodiment of the present invention.

In FIGS. 4A to 4C, arrows indicate the amount of movement and direction thereof in step and scanning of an exposure field with respect to an exposure shot on a wafer. The double-line arrows indicate exposure scans. The arrows in these Figures express the path of the center position of the exposure field on the fixed side as viewed from the wafer on the side that actually moves. Properly speaking, the exposure field has an effective length of greater than zero in the Y direction, i.e., the width in the transverse direction is greater than zero. However, the description rendered in connection with these Figures assumes that this dimension is zero. Arrows indicative of the stepping operation are represented by bold lines, slender lines and broken lines. The bold lines represent the path when the present invention is applied and the broken lines represent the path in the case of the prior art. The fine lines indicate paths common to both cases.

FIG. 4A illustrates a case where the Y stepping direction and the scanning direction immediately prior thereto are opposite when, while repeatedly reversing the shot scanning direction in the order of exposure, exposure of the same row of shots ends and a step in the Y direction is made to the next row of shots.

The exposure field exposes a shot 51 by scanning exposure 54. This is followed by stepping movement in the X direction and simultaneous movement 55 for overrun in the Y direction, approach 56 until a prescribed scanning velocity is attained and then performing of scanning exposure 57.

In the prior art, the XY stepping movement is carried out following the end of overrun 58. According to the stage control method of the present invention, however, when the exposure of shots on the same row ends, stepping movement 60 up to the approach starting position of the next row of shots is performed without the usual overrun operation. Alternatively, the process composed of the movements 58, 59 may be compared with the stepping movement 60 devoid of overrun, and whichever takes the shorter amount of time for movement may be selected. Another option is to select either one if the traveling times are equal. It will suffice if stepping time in the X direction in this embodiment is judged solely by a difference in the time for stepping movement in the Y direction because there is no difference in the traveling distance undergoing comparison.

Figure 5:
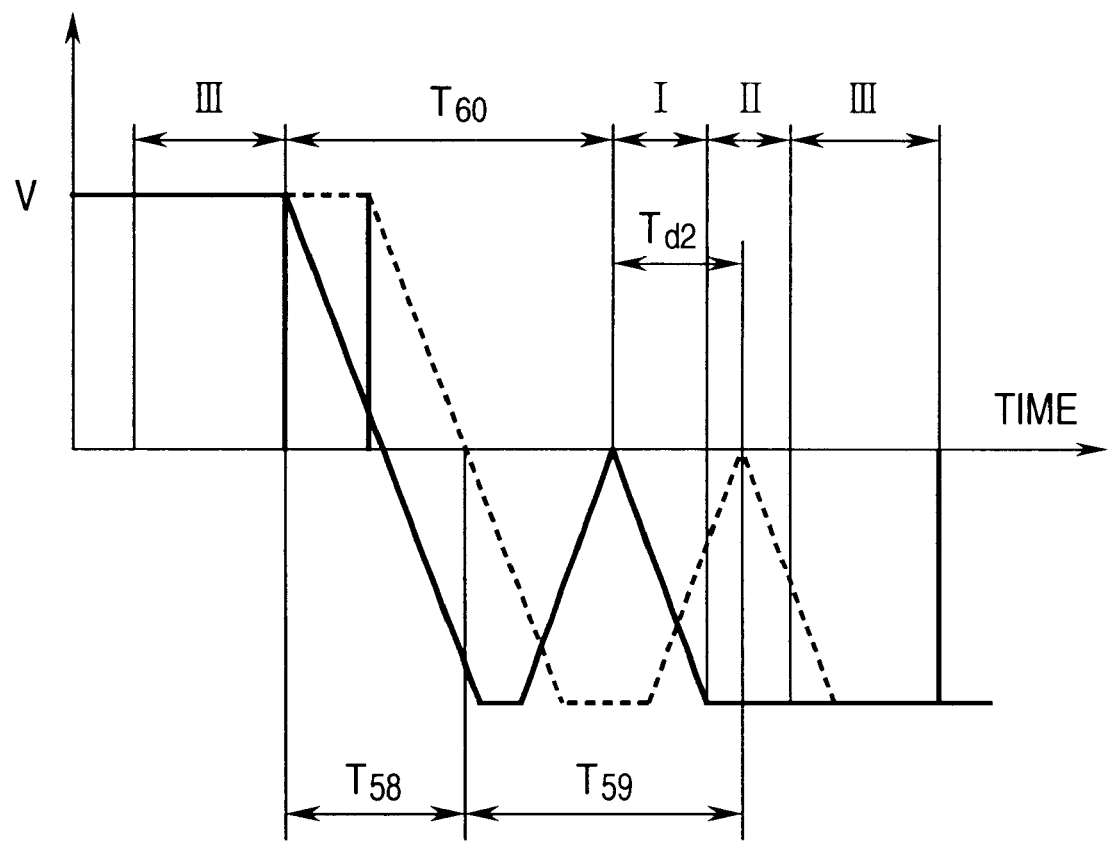
FIG. 5 is a diagram showing a velocity profile of a scanning stage according to the third embodiment of the present invention.

FIG. 5 illustrates a Y-direction velocity profile of movements 58, 59 and 60. Here the positive Y direction is taken as the positive side of the velocity axis, the movements 58, 59 are indicated by the dashed line and the movement 60 is indicated by the solid line. The symbols employed in the first embodiment are used here as is. In this embodiment, however, the operation for accelerating the stage after scanning exposure set forth in the above-mentioned embodiment is not carried out in order to simplify the description. Let T58, T59, T60 represent the traveling times associated with the movements 58, 59, 60, respectively. Overrun distance in the Y direction Lor is given by the following equation:

$$Lor = V \times (Ts + 0.5 \times Ta) \quad (9)$$

If we let Lex represent the length of the exposure shot in the Y direction and by equivalence the length of the movement 59, the following relations are established:

$$T58 = Ts + Ta \quad (10)$$

$$T59 = Lex/V\max + V\max/a \quad (11)$$

$$T60 = (Lex - Lor)/V\max + V\max/a + (1 + 0.5 \times V/V\max)Ta \quad (12)$$

Accordingly, the time difference between the movements 58, 59 and the movement 60 is as follows:

$$T58 + T59 - T60 = Lor/V\max + Ts + Ta - (1 + 0.5 \times V/V\max)Ta = (1 + V/V\max)Ts < 0 \quad (13)$$

and thus it can be determined that selection of movement 60 is preferable. Accordingly, the path of the exposure area moves along the path of movement 60. If the time for stepping in the X direction is shorter than the time for stepping in the Y direction, then the stage control method according to this embodiment will shorten processing time by the amount of the above-mentioned time difference as compared with the stage control method of the prior art.

FIG. 4B illustrates the operation of the present invention in a case where the Y stepping direction and the immediately preceding scanning direction are the opposite of each other. As in the case of FIG. 4A described above, this embodiment is such that the stage is moved to the approach starting position of the next row of shots solely by movement 63 without the conventional overrun 61 and thereafter XY stepping movement 62. Alternatively, the Y stepping time may be compared and the movement 63 may be performed if it takes a shorter traveling time. As a result, wafer processing time is shortened in a manner similar to that of FIG. 4A.

FIG. 4C shows an example of a case where the scanning directions of mutually adjacent shots that undergo successive exposures are the same. Such a designation of shot traveling distance may be applied to the entire area of the wafer as a matter of course or to the shots on part of the wafer. As in the cases of FIGS. 4A and 4B described above, this embodiment is such that the stage is moved to the approach starting position of the next shot solely by movement 68 without the movements 65, 65 that are required in the prior art. Alternatively, the Y stepping time may be compared and the movement that results in a shortening of the traveling time for the Y stepping time may be selected. In either case, the wafer processing time can be shortened by a wide margin.

Thus, by comparing Y stepping time when overrun travel is and is not present and using the result to identify stepping movement for which little stepping time suffices, the overrun operation may be omitted depending upon the case to thereby make possible an improvement in throughput.

According to this embodiment, the velocity profile at the stepping time is provided with only three types of travel, namely travel at uniform velocity, travel at uniform acceleration and travel at uniform deceleration. However, in a manner similar to that of the second embodiment, the present invention can be applied in a similar fashion also in a case where stepping movement is performed in such a manner that acceleration will vary continuously. As long as problems such as vibration do not arise, acceleration may be controlled continuously over part of the stepping movement, e.g., only immediately prior to the halting of stepping movement. This is similar to the foregoing embodiment.

Furthermore, according to this embodiment, the operation of the foregoing embodiment for shortening overrun time by accelerating the stage after the end of scanning exposure is not carried out in order to simplify the description. However, it goes without saying that such operation may be applied to this embodiment as well.

Fourth Embodiment

Figure 6:
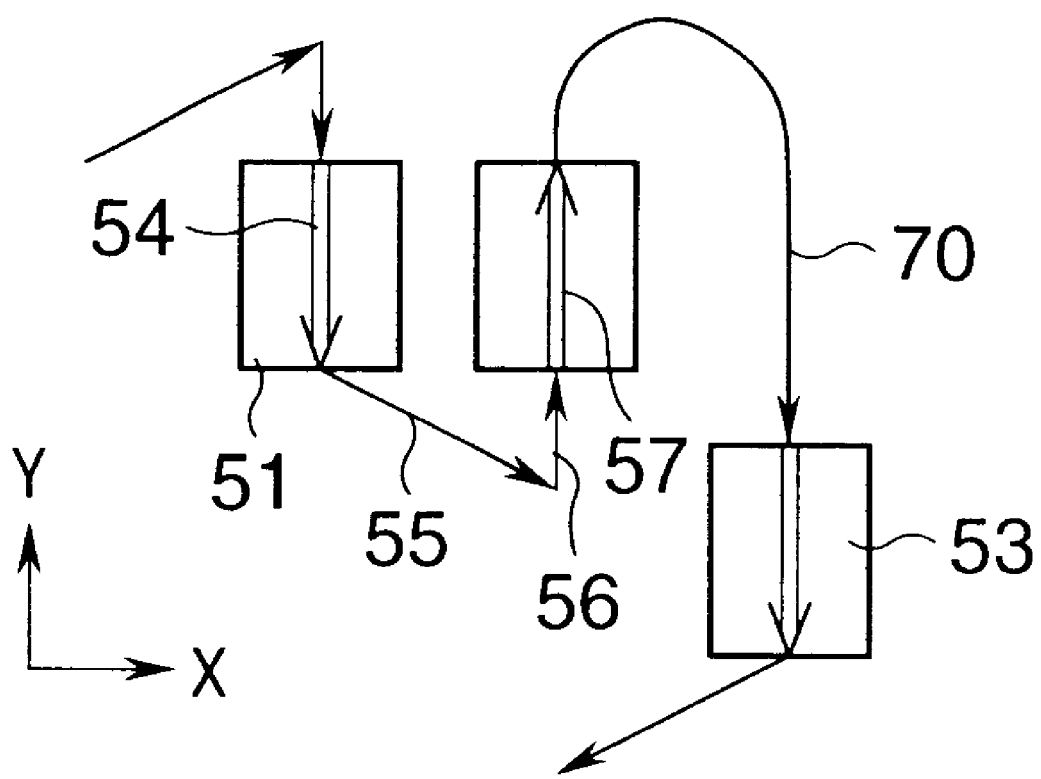
FIG. 6 is a diagram illustrating the path of an exposure field according to a fourth embodiment of the present invention.

FIG. 6 illustrates an improvement on the stage control method of the embodiment described above.

According to this embodiment, the Y stepping direction and the scanning direction immediately prior thereto are opposite when exposure of the same row of shots ends and a step in the Y direction is made to the next row of shots in a manner similar to that of FIG. 4A of the foregoing embodiment.

The exposure field exposes a shot 51 by scanning exposure 54. This is followed by stepping movement in the X direction and simultaneous movement 55 for overrun in the Y direction, approach 56 until a prescribed scanning velocity is attained and then continuation of scanning exposure 57.

In the embodiment described above, when the exposure of shots on the same row ends, stepping movement 60 up to the approach starting position of the next row of shots is performed without the usual overrun operation. According to this embodiment, however, the velocity of the stage is controlled to attain the scanning velocity (movement 70) during stepping movement, and approach up to the exposure area is eliminated.

Figure 7:
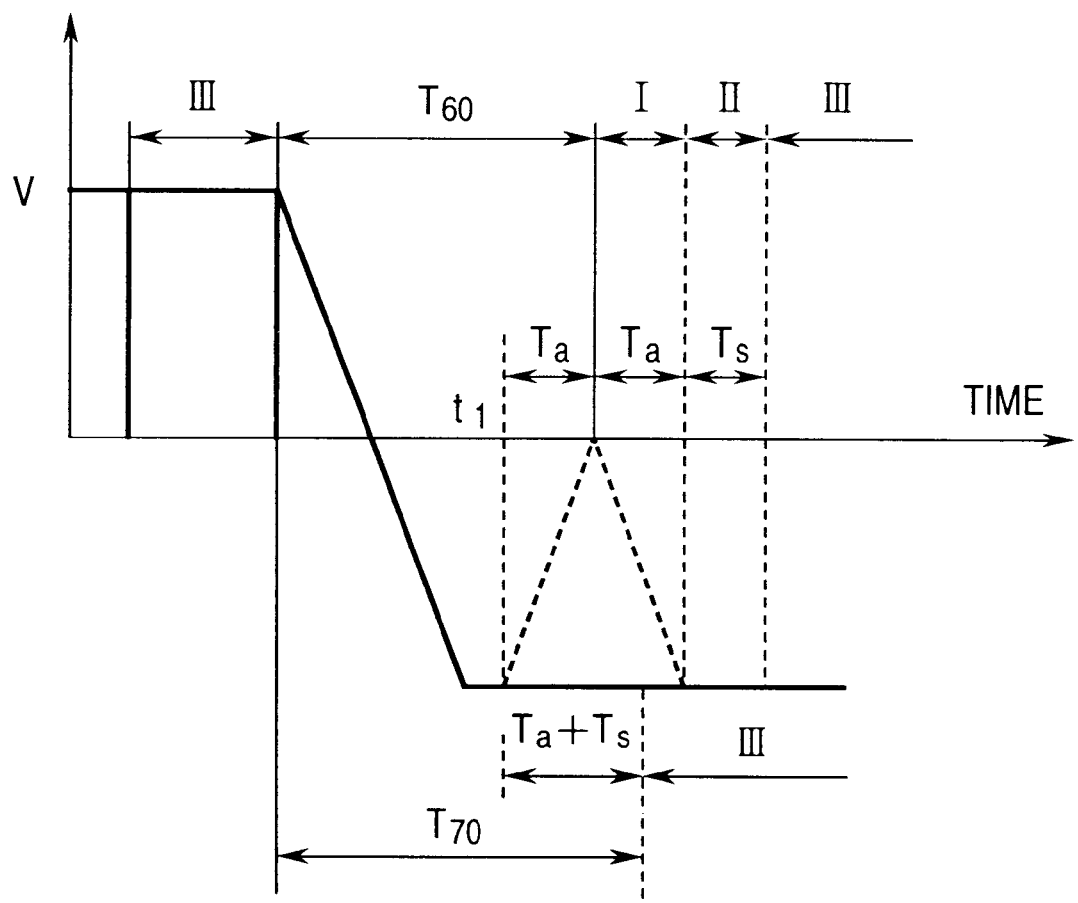
FIG. 7 is a diagram showing a velocity profile of a scanning stage according to the third embodiment of the present invention.

FIG. 7 illustrates a Y-direction velocity profile of movements 60 and 70. Here the positive Y direction is taken as the positive side of the velocity axis, the movement 60 is indicated by the dashed line and the movement 70 is indicated by the solid line. The symbols employed in the first embodiment are used here as is. Further, in order to simplify the description, the acceleration of the stage after scanning exposure performed in the foregoing embodiment is not carried out in this embodiment. Let T70 represent the traveling time associated with movement 70.

In movement 60, the end of exposure and scanning of shot 57 is followed immediately by deceleration so that the stage is accelerated in the —Y direction. In order to bring the stage to rest at the approach starting position of the next shot after acceleration in the —Y direction ends, deceleration of the stage begins. Let this time be denoted by t1. Following an interval Ta from time t1, the stage comes to rest at the approach starting position of the next shot and acceleration for the approach begins. After an interval Ta+Ta from time t1, acceleration ends and the settling operation begins. Then, after an interval Ta+Ta+Ts from time t1, velocity is controlled until the synchronous deviation falls within tolerance, and exposure begins.

After the end of exposure and scanning of shot 57, deceleration is performed immediately and the stage is accelerated in the —Y direction in movement 70 of this embodiment as well. However, at time t1, the stage is not decelerated and keeps traveling up to the exposure starting position at the prevailing velocity. Since the stage is moved while being held at the prescribed velocity up to the exposure starting position, a transition to the exposure operation can be made immediately after the exposure starting position is reached.

In comparison with movement 60, movement 70 according to this embodiment makes it possible to arrive at the exposure starting position quicker, the extent of the shortening of time being equivalent to the time saved by not decelerating the stage. Consequently, as will be understood from FIG. 7, movement 70 makes it possible to shorten processing time by the length of time Ta in comparison with movement 60.

According to this embodiment, the velocity profile at stepping time is provided with only three types of travel, namely, travel at uniform velocity, travel at uniform acceleration and travel at uniform deceleration. However, in a manner similar to that of the second embodiment, the present invention can be applied in a similar fashion also in a case where stepping movement is performed in such a manner that acceleration will vary continuously. As long as problems such as vibration do not arise, acceleration may be controlled continuously over part of the stepping movement, e.g., only immediately prior to the halting of stepping movement. This is similar to the foregoing embodiment.

Furthermore, according to this embodiment, the operation of the first and second embodiments for shortening overrun time by accelerating the stage after the end of scanning exposure is not carried out in order to simplify the description. However, it goes without saying that such operation may be applied to this embodiment as well.

Fifth Embodiment

Described next will be an embodiment of a process for producing a semiconductor device utilizing the exposure apparatus set forth above.

Figure 8:
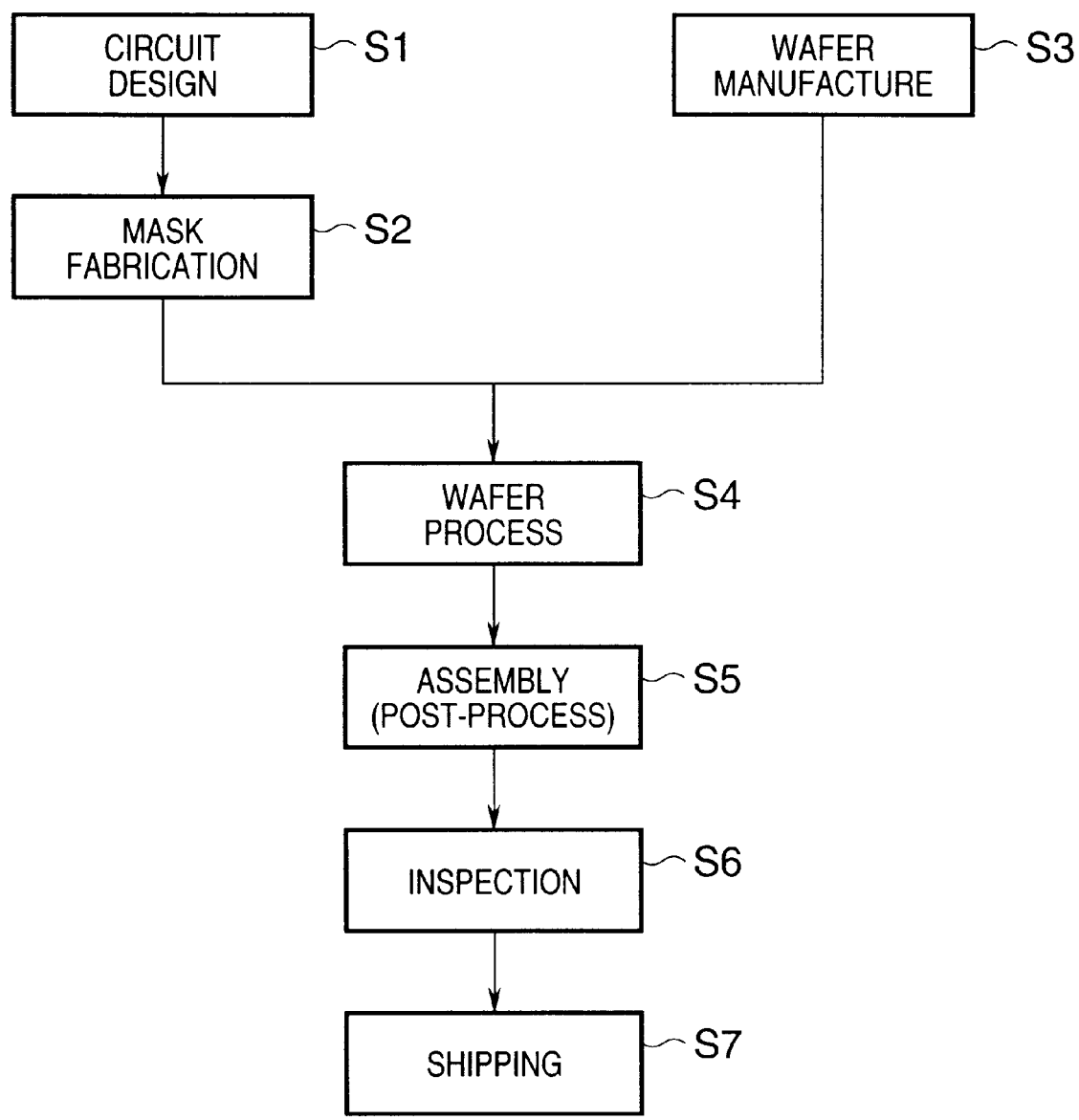
FIG. 8 is a diagram showing the flow of manufacture of a semiconductor device.

FIG. 8 illustrates the flow of manufacture of a semiconductor device (a semiconductor chip such as an IC or LSI chip, a liquid crystal panel, a CCD, etc.). The circuit for the semiconductor device is designed at step 1 (circuit design). A mask on which the designed circuit pattern has been formed is fabricated at step 2 (mask fabrication). A wafer is manufactured using a material such as silicon or glass at step 3 (wafer manufacture). The actual circuit is formed on the wafer by lithography, using the mask and wafer that have been prepared, at step 4 (wafer process), which is also referred to as a "pre-process". A semiconductor chip is obtained, using the wafer fabricated at step 4, at step 5 (assembly), which is also referred to as a "post-process". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7).

Figure 9:
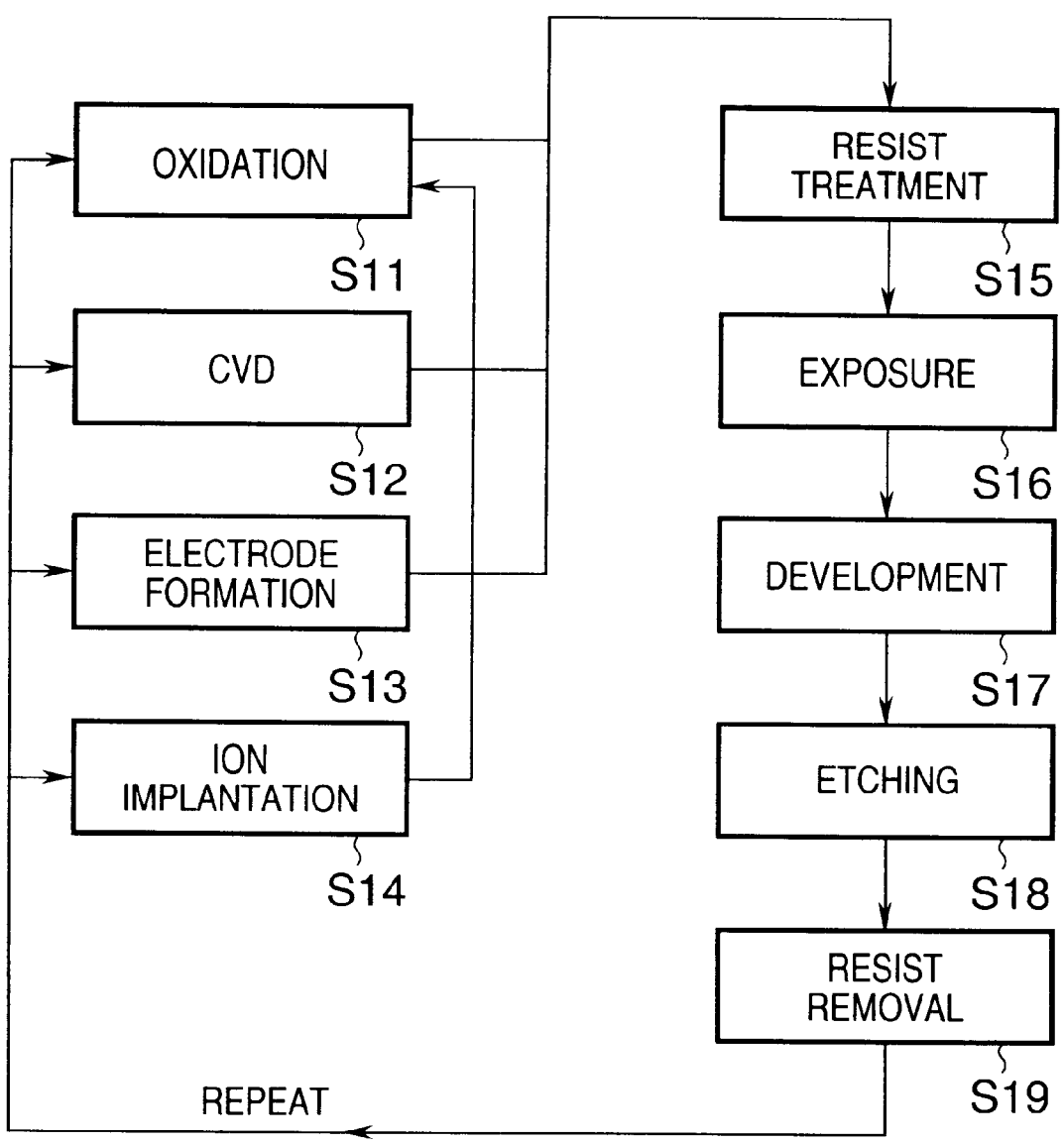
FIG. 9 is a diagram showing the flow of a wafer process.

FIG. 9 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described projection exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the production process of this embodiment is employed, semiconductor devices having a high degree of integration can be manufactured at low cost. Manufacture of such semiconductor devices using the prior-art techniques was difficult.

In accordance with the stage control method of the present invention, a stage is accelerated before the stage is decelerated and stopped. This makes it possible to shorten the time for travel over the overrun distance.

Further, in accordance with the exposure method of the present invention, the stage is accelerated before the stage is decelerated and stopped. This makes it possible to shorten the time for travel over the overrun distance.

Further, in accordance with the exposure method of the present invention, in certain cases, a transition can be made to a second step without stopping the stage at the starting position of a first step. This makes it possible to improve throughput of the exposure apparatus.

As many apparently widely different embodiments of the present invention can be made without departing from the spirit and scope thereof, it is to be understood that the invention is not limited to the specific embodiments thereof except as defined in the appended claims.

What is claimed is:

1. A stage control method of controlling a stage for moving a substrate to perform a scanning exposure of an area on the substrate, said method comprising:

a first step of accelerating a stage to a scanning exposure velocity for performing the scanning exposure;

a second step of transporting the stage at the scanning exposure velocity; and a third step of accelerating the stage once from the scanning exposure velocity, and decelerating the stage, after the scanning exposure of the area is completed, wherein an overrun distance over which the stage travels until the stage stops after execution of said second step, and an approach distance necessary for accelerating the stage in said first step when the stage is driven a next time, are approximately equal.

2. The method according to claim 1, wherein said first to third steps are executed repeatedly and the stage is moved back and forth.

3. The method according to claim 1, further comprising a calculation step of calculating an acceleration time of the stage prior to said third step.

4. The method according to claim 1, wherein an approach distance over which the stage attains the predetermined velocity from a rest position in said first step, and an overrun distance over which the stage travels until the stage stops after execution of said second step, are approximately equal.

5. The method according to claim 1, wherein acceleration of the stage at said first step is performed in such a manner that acceleration varies continuously.

6. The method according to claim 1, wherein deceleration of the stage at said third step is performed in such a manner that acceleration varies continuously.

7. The method according to claim 1, wherein acceleration of the stage prior to said third step is performed in such a manner that acceleration varies continuously.

8. A stage apparatus for controlling a stage for moving a substrate to perform a scanning exposure of an area on the substrate, said apparatus comprising:

a stage which is capable of being moved;

an actuator which drives the stage; and a control system controlling the actuator in accordance (i) a first step of accelerating a stage to a scanning exposure velocity for performing the scanning exposure, (ii) a second step of transporting the stage at the scanning exposure velocity, and (iii) a third step of accelerating the stage once from the scanning exposure velocity, and decelerating the stage, after the scanning exposure of the area is completed, wherein an overrun distance over which the stage after transporting at the scanning exposure velocity, and an approach distance for transporting the stage at the scanning exposure velocity the next time, are approximately equal.

9. The apparatus according to claim 8, wherein said control system moves the stage back and forth.

10. The apparatus according to claim 8, wherein said control system calculates an acceleration time of the stage.

11. The apparatus according to claim 8, wherein an approach distance over which the stage attains the scanning exposure velocity, and an overrun distance over which the stage travels after transporting at the scanning exposure velocity, are approximately equal.

12. The apparatus according to claim 8, wherein said control system performs acceleration of the stage at the scanning exposure velocity in such a manner that acceleration varies continuously.

13. The apparatus according to claim 8, wherein said control system performs deceleration of the stage at the scanning exposure velocity in such a manner that acceleration varies continuously.

14. The apparatus according to claim 8, wherein said control system performs acceleration of the stage prior to deceleration of the stage in such a manner that acceleration varies continuously.

15. A device manufacturing method comprising:

an application step of applying a photosensitive agent to a substrate;

an exposure step of performing a scanning exposure of an area on the substrate while moving the substrate, said exposure step including:

(i) a first step of accelerating a stage to a scanning exposure velocity for the scanning exposure;

(ii) a second step of transporting the stage at the predetermined velocity for the scanning exposure; and (iii) a third step of accelerating the stage once from the scanning exposure velocity, and decelerating the stage, after the scanning exposure of the area is completed, wherein an overrun distance over which the stage travels until it stops after execution of said second step, and an approach distance in the scanning direction necessary for the first step when the stage is driven the next time, are approximately equal; and a step of developing the substrate that has been exposed.

16. A The method according to claim 15, wherein said first to third steps are executed repeatedly and the stage is moved back and forth.

17. The method according to claim 15, further comprising a calculation step of calculating an acceleration time of the stage.

18. The method according to claim 17, wherein a distance over which the stage makes an approach run in the scanning direction until it attains the scanning exposure velocity from a rest position owing to said first step, and an overrun distance over which the stage travels along the scanning direction until it stops after execution of said second step, are approximately equal.

19. The method according to claim 15, wherein the stage is a reticle stage holding a reticle having the pattern.

20. The method according to claim 15, wherein the stage is a substrate stage holding the substrate.

21. The method according to claim 20, wherein the substrate stage is capable of being moved in a direction that perpendicularly intersects the scanning direction.

22. The method according to claim 21, wherein said third step includes a moving step of moving the stage in the direction that perpendicularly intersects the scanning direction.

23. The method according to claim 22, wherein a position at which the stage is stopped in said third step is approximately the same as a starting position of said first step for exposing the substrate a next time.

24. The method according to claim 15, wherein acceleration of the stage at said first step is performed in such a manner that acceleration varies continuously.

25. The method according to claim 15, wherein deceleration of the stage at said third step is performed in such a manner that acceleration varies continuously.

26. The method according to claim 15, wherein acceleration of the stage prior to said third step is performed in such a manner that acceleration varies continuously.

27. A device manufacturing method comprising:
- an application step of applying a photosensitive agent to a substrate;
- an exposure step of performing a scanning exposure of the substrate by an exposure method including:
  - (i) a first step of accelerating a stage to a scanning exposure velocity for performing the scanning exposure, the stage holding a substrate;
  - (ii) a second step of transporting the stage at the scanning exposure velocity and exposing the substrate to a pattern, which has been formed on a master plate, during travel of the stage in a scanning direction, and
  - (iii) a third step of decelerating the stage traveling at the scanning exposure velocity, which is accelerated once between the second step and the third step, the substrate being exposed to a plurality of patterns by repeating said first through third steps, wherein a position at which the stage is stopped by the third step is substantially the same as a starting position of the first step for exposing the substrate the next time; and
- a step of developing the substrate that has been exposed.

28. The method according to claim 27, wherein the scanning direction of the stage in said second step is opposite to the scanning direction which prevailed when exposure was performed previously.

29. The method according to claim 27, wherein the scanning direction of the stage in said second step is identical with the scanning direction which prevailed when exposure was performed previously.

30. A device manufacturing method comprising:
- an application step of applying a photosensitive agent to a substrate;
- an exposure step of performing scanning exposure of the substrate by an exposure method including:
  - (i) a first step of accelerating a stage to a scanning exposure velocity for performing the scanning exposure, the stage holding a substrate,
  - (ii) a second step of transporting the stage at the scanning exposure velocity and exposing the substrate to a pattern, which has been formed on a master plate, during travel of the stage in a scanning direction, and
  - (iii) a third step of decelerating the stage traveling at the scanning exposure velocity, which is accelerated once between the second step and the third step, the substrate being exposed to a plurality of the patterns by repeating said first through third steps, and when, after said second step, the direction of movement of the stage in relation to the scanning direction thereof when the stage has been moved to a starting position of a subsequent first step coincides with the scanning direction of the stage in the second step when the next exposure is performed, a transition to the second step is made without stopping the stage at the starting position of said first step; and
- a step of developing the substrate that has been exposed.

31. A stage control method comprising:
- a first step of accelerating a stage holding a substrate to a scanning exposure velocity for performing a scanning exposure of the substrate;
- a second step of transporting the stage at the scanning exposure velocity and exposing the substrate to a pattern which has been formed on a master plate during travel of the stage in a scanning direction;
- a third step of decelerating the stage after accelerating once the stage traveling at the scanning exposure velocity; and
- a comparison step of comparing a step of moving a starting position of a next first step after an overrun operation of the second step in order to perform the third step, with a step of moving a starting position of the next first step without the overrun operation.

32. The method according to claim 31, wherein the substrate is exposed to a plurality of the patterns by repeating said first through third steps.

33. The method according to claim 31, further comprising a step of selecting any one of steps that have been compared to the comparison step.

34. The method according to claim 32, wherein the plurality of the patterns are arrayed in a two-dimensional grid on the substrate.

35. The method according to claim 31, wherein the scanning direction of the stage in said second step is opposite to the scanning direction which prevailed when exposure was performed previously.

36. The method according to claim 31, wherein the scanning direction of the stage in said second step is identical with the scanning direction which prevailed when exposure was performed previously.

37. A device manufacturing method comprising:
- an application step of applying a photosensitive agent to a substrate held by a stage;
- a control step of controlling the stage by a stage control method including:
  - (i) a first step of accelerating a stage, holding a substrate, to a scanning exposure velocity for performing scanning exposure of the substrate;
  - (ii) a second step of transporting the stage at the scanning exposure velocity and exposing the substrate to a pattern which has been formed on a master plate during travel of the stage in a scanning direction;
  - (iii) a third step of decelerating the stage after accelerating once the stage traveling at the scanning exposure velocity; and
  - (iv) a comparison step of comparing a step of moving a starting position of a next first step after an overrun operation of the second step in order to perform the third step, with a step of moving a starting position of the next first step without the overrun operation; and
- a step of developing the substrate that has been exposed.

* * * * *

UNITED STATES PATENT AND TRADEMARK OFFICE
CERTIFICATE OF CORRECTION

PATENT NO. : 6,809,798 B1
DATED : October 26, 2004
INVENTOR(S) : Itaru Fujita

It is certified that error appears in the above-identified patent and that said Letters Patent is hereby corrected as shown below:

Column 2,
Line 33, "IV." should read -- V. --.

Column 6,
Line 17, "wafer stage 6" should read --wafer stage 12 --.

Column 14
Line 40, "claim 17," should read -- claim 15, --.

Signed and Sealed this

Eleventh Day of January, 2005

JON W. DUDAS
*Director of the United States Patent and Trademark Office*